United States Patent [19]

Sato

[11] Patent Number: 5,668,396

[45] Date of Patent: Sep. 16, 1997

[54] BIPOLAR TRANSISTOR HAVING THIN INTRINSIC BASE WITH LOW BASE RESISTANCE AND METHOD FOR FABRICATING THE SAME

[75] Inventor: Fumihiko Sato, Tokyo, Japan

[73] Assignee: NEC Corporation, Tokyo, Japan

[21] Appl. No.: 533,451

[22] Filed: Sep. 25, 1995

Related U.S. Application Data

[63] Continuation of Ser. No. 158,585, Nov. 29, 1993, abandoned.

[30] Foreign Application Priority Data

Nov. 27, 1992 [JP] Japan ..................... 4-341421

[51] Int. Cl.$^6$ .................. H01L 29/00; H01L 27/082; H01L 27/102; H01L 29/70
[52] U.S. Cl. .................. 257/517; 257/588; 257/373
[58] Field of Search .................. 257/517, 518, 257/588, 592, 593, 197, 198, 373, 374, 591, 585, 586, 587

[56] References Cited

U.S. PATENT DOCUMENTS

| | | | |
|---|---|---|---|
| 4,782,030 | 11/1988 | Katsumata et al. | 257/518 |
| 5,073,810 | 12/1991 | Owada et al. | 257/518 |
| 5,177,583 | 1/1993 | Endo et al. | 257/592 |
| 5,245,204 | 9/1993 | Morishita | 257/197 |
| 5,247,192 | 9/1993 | Nii | 257/198 |
| 5,323,031 | 6/1994 | Shoji et al. | 257/592 |
| 5,374,846 | 12/1994 | Takemura | 257/587 |
| 5,402,002 | 3/1995 | Meister et al. | 257/592 |
| 5,465,006 | 11/1995 | Chen | 257/592 |

FOREIGN PATENT DOCUMENTS

| | | | |
|---|---|---|---|
| 62-216364 | 9/1987 | Japan | 257/198 |
| 1-233767 | 9/1989 | Japan | 257/592 |
| 1-296664 | 11/1989 | Japan | 257/198 |
| 4-96373 | 3/1992 | Japan | 257/517 |
| 4-33073 | 11/1992 | Japan | |

OTHER PUBLICATIONS

English Language Abstract of JPA 4-330730 (A).

*Primary Examiner*—Stephen Meier
*Attorney, Agent, or Firm*—Sughrue, Mion, Zinn, Macpeak and Seas

[57] ABSTRACT

A bipolar transistor has a first semiconductor region of an n-type epitaxial layer surrounded by a first insulating film, a second insulating film of silicon oxide having an opening, a second semiconductor region as a base link region of a p-type formed in the opening and having a high impurity concentration and a thickness substantially the same as that of the second insulating film, a third semiconductor region as an intrinsic base of a p-type having a thickness thinner than that of the second insulating film, a sidewall insulating film covering the third semiconductor region, and a fourth semiconductor of a p-type formed on the third semiconductor region and surrounded by the side-wall insulating film. The reduction in the thickness of the intrinsic base is achieved without reducing the thickness of the base link region and thus it is possible to realize a bipolar transistor in which a cut-off frequency is high and yet the base resistance is low.

11 Claims, 6 Drawing Sheets

BIPOLAR TRANSISTOR HAVING THIN INTRINSIC BASE WITH LOW BASE RESISTANCE AND METHOD FOR FABRICATING THE SAME

This is a continuation of application Ser. No. 08/158,585 filed Nov. 29, 1993 now abandoned.

BACKGROUND OF THE INVENTION

(1) Field of the Invention

The present invention relates to a semiconductor device and a method for fabricating the same, and more particularly to a bipolar transistor having a thin intrinsic base with a low base resistance and a method for fabricating the same.

(2) Description of the Related Art

It is known that, in the bipolar transistor, the thinner the base the higher the cut-off frequency will be with this being a yardstick for a higher speed performance. It is also known that to lower the resistance of the base leading portions and to scale down the transistor are effective for achieving a higher speed in the transistor.

FIG. 1 shows in diagrammatic sectional view an earlier proposed semiconductor device disclosed in Japanese Patent Application Kokai Publication No. Hei 4-330730 (in which the inventor is one of the co-inventors in the present application). In the case of the disclosed device, the reduction in the thickness of the base layer is realized by forming a base and an emitter using a low temperature epitaxial growth technique without using a diffusion process therein.

In the proposed device, as shown in FIG. 1, an $n^+$-type buried layer 2 in which a high concentration Arsenic (As) is introduced is selectively formed within a surface region of a p-type silicon substrate 1 whose resistivity is 10~15 Ω-cm. On the buried layer 2, there is formed an n-type epitaxial layer 3 having a thickness of 1.0 82 m in which an n-type impurity in a concentration in the order of $5 \times 10^{15}$ cm$^{-3}$ is introduced. The n-type epitaxial layer 3 is separated, by a known selective oxidation process, into a plurality of island regions by a selective oxide film 4 which reaches the silicon substrate 1. For simplification of the drawings, FIG. 1 shows only one island region corresponding to one n-type buried region 2. This island region is separated into two portions by a selective oxide film 4a which reaches the buried region 2. The portion at the left hand functions as a collector region. The portion at the right hand is subjected to phosphorous diffusion to make it an $n^+$-type diffusion layer 8 which serves as a region from which the collector is led out. This is how the semiconductor substrate 100 is formed.

The semiconductor substrate 100 is covered with a silicon nitride film 5a. In this film, there are formed an opening 101 which exposes a part of the collector region (epitaxial layer 3) for forming the base and another opening 102 which exposes an upper surface of the $n^+$-type diffusion layer 8 for leading out the collector. Preferably, a thin silicon oxide film is provided under the silicon nitride film 5a.

On the silicon nitride film 5a, there are selectively formed a p-type polycrystalline silicon layer 8 and an n-type polycrystalline silicon layer 7.

The polycrystalline silicon layer 6 horizontally extends into the opening 101 from the edge thereof. A p-type polycrystalline silicon layer 13 is formed between the undersurface of the horizontally extended portion of the polycrystalline silicon layer 6 and the epitaxial layer 3 which is the collector region. On the other hand, on the exposed part of the epitaxial layer 3, there is formed a p-type base region 14c by an epitaxial growth process as described in the Japanese Patent Application Kokai Publication referred to above. This base region 14c and the polycrystalline silicon layer 13 are in contact with each other.

An n-type polycrystalline silicon layer 7 formed in the other opening 102 is in contact with the $n^+$-type diffusion layer 8 which is the region for leading out the collector.

The upper and side surfaces of the polycrystalline silicon layer 8 are covered with the silicon oxide film 11a which has an emitter opening on an emitter forming region. In this emitter opening, the side surfaces of the polycrystalline silicon layer 13 and the silicon oxide film 11a are covered with a silicon oxide film 15a.

In the exposed part of the base region 14c, there is formed an n-type single-crystal silicon film 16 which constitutes the emitter region.

On each of the polycrystalline silicon layers 6, 7 and the single-crystal silicon layer 16, there is formed a metal electrode 17 of an aluminum (Al) type material.

In the semiconductor device proposed in the Japanese Patent Application Kokai Publication referred to above, the Boron concentration of the base region portion immediately beneath the emitter region (single-crystal silicon layer 16) which is the intrinsic base and the Boron concentration of the base link region constituted by the non-intrinsic portion of the base region 14c and the polycrystalline silicon layer 13 are substantially the same with each other. Also, the thickness of the base link region right beneath the silicon oxide film 15a is substantially the same as the thickness of the intrinsic base region, so that sheet resistance at the base link region becomes considerably high. As a result, the base resistance increases and a high speed operation of the transistor is hindered. That is, with the transistor having the above described configuration, it is difficult to achieve both the reduction in the thickness of the Intrinsic base and the reduction in the base resistance at the same time.

SUMMARY OF THE INVENTION

An object of the present invention, therefore, is to provide an improved transistor in which both the reduction in the thickness of the intrinsic base and the reduction in the resistance at the base link region are achieved at the same time and which enables a high speed operation.

According to one aspect of the invention, there is provided a semiconductor device comprising:

a first semiconductor region of a first conductivity type formed by being surrounded by a first insulating film;

a second insulating film formed on the first insulating film and the first semiconductor region and having an opening on the first semiconductor region;

a second semiconductor region of a second conductivity type with a high impurity concentration formed by covering side periphery of the opening on the first semiconductor region and having a thickness substantially equal to that of the second insulating film;

a third semiconductor region of the second conductivity type formed by covering the first semiconductor region and an inner periphery of the second semiconductor region and having a thickness thinner than that of the second insulating film;

a sidewall insulating film covering an inner periphery of side walls of the third semiconductor region; and a fourth semiconductor region of the first conductivity type formed on the third semiconductor region by being surrounded by the sidewall insulating film.

According to another aspect of the invention, there is also provided a method for fabricating a semiconductor device, the method comprising the steps of:

providing a first semiconductor region of a first conductivity type;

providing a first insulating film surrounding the first semiconductor region;

providing a second insulting film on the first semiconductor region and the first insulating film;

providing a polycrystalline semiconductor layer over at least the second insulating film such that it extends over the first semiconductor region;

forming, on the polycrystalline semiconductor layer and the second insulating film, a third insulating film of an insulating material having etching characteristics different from those of the second insulating film;

etching a hole in the third insulating film and the polycrystalline semiconductor layer to expose a portion of a surface of the second insulating film;

depositing an insulating material having etching characteristics different from those of the second insulating film over the polycrystalline semiconductor layer and on the hole to increase the thickness of the third insulating film;

removing a part of the third insulating film in the vicinity of the hole to expose a portion of the surface of the second insulating film;

etching the second insulating film through the hole formed by the removed portion of the third insulating film to expose a portion of a surface of the first semiconductor region and to undercut a portion of the third insulating film under the third insulating film and the polycrystalline semiconductor layer such that there is formed an opening and a cantilever structure consisting of the third insulating film and the polycrystalline semiconductor layer extending partly over the opening;

forming a second semiconductor region by growing a semiconductor layer containing impurities of the second conductivity type in a high concentration within the opening;

etching the second semiconductor region with the third insulating film used as a mask to expose a part of the surface of the first semiconductor region in the opening;

forming a third semiconductor region of the second conductivity type having an impurity concentration lower than that of the second semiconductor region on the surface of the first semiconductor region and on the inner periphery of the second semiconductor region to a thickness not exceeding that of the second semiconductor region;

forming a sidewall insulating film over inner periphery portions of side walls of the third semiconductor region; and forming a fourth semiconductor region of the first conductivity type on the third semiconductor region and surrounded by the sidewall insulating film.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Now, preferred embodiments of the invention are explained with reference to the drawings. It should be noted that, throughout the following explanation, similar reference symbols or numerals refer to the same or similar elements in all the figures of the drawings.

Figure 2:
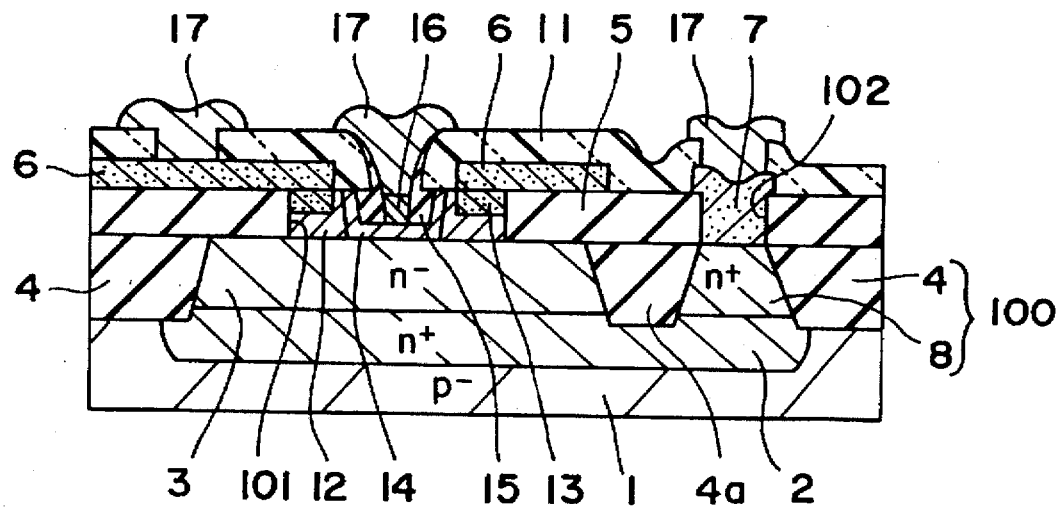
FIG. 2 is a diagrammatic sectional view showing a semiconductor device of a first embodiment according to the invention.

FIG. 2 shows in sectional view a bipolar transistor of a first embodiment according to the invention. As shown therein, on a p-type silicon substrate 1 having a resistivity of 10–20 $\Omega$-cm, there is selectively formed an $n^+$-type buried layer 2 having an Arsenic concentration of $1\times 10^{20}$ cm$^{-3}$ and a thickness of 2 µm. On this buried layer 2, there is formed an n-type epitaxial layer 3 in which Phosphorous (P) is doped in a concentration of about $1\times 10^{16}$ cm$^{-3}$ and which has a thickness of about 0.7 µm. The n-type epitaxial layer 3 is element-isolated into a plurality of island regions by a selective oxide film 4 formed by a LOCOS (Local Oxidation of Silicon) method. In the drawings, only one island corresponding to one buried layer 2 is shown. This island region is divided into two portions by a selective oxide film 4a which reaches the buried region 2. The portion at the left hand functions as a collector region. The portion at the right hand is subjected to phosphorous diffusion to make it an $n^+$-type diffusion layer 8 which serves as a region from which the collector is led out. The semiconductor substrate 100 is formed by the regions illustrated and explained as above.

The semiconductor substrate 100 thus formed is covered with a silicon oxide film 5. In this film, there are formed an opening 101 which exposes a part of the epitaxial layer 3 for forming the base and another opening 102 which exposes an upper surface of the $n^+$-type diffusion layer 8 for leading out the collector.

On the silicon oxide film 5, there are selectively formed a polycrystalline silicon layer 6 in which p-type impurities are doped in a high concentration and a polycrystalline silicon layer 7 in which n-type impurities are doped in a high concentration.

The polycrystalline silicon layer 6 horizontally extends into the opening 101 from the edge thereof. A $p^+$-type polycrystalline silicon layer 18 is formed on the bottom-surface of the horizontally extended portion of the polycrystalline silicon layer 6. On a predetermined region starting from the edge of the opening 101 on the epitaxial layer 3, there is formed a single-crystal silicon layer 12 which is in contact with the bottom and side surfaces of the polycrystalline silicon layer 13 and which constitutes the base link region together with the silicon layer 13. An intrinsic base film 14 is formed, within the opening 101, to cover the portion of the region of the epitaxial layer 3 that is not covered by the single-crystal silicon layer 12 and the side of the single-crystal silicon layer 12.

An n-type polycrystalline silicon layer 7 formed in the opening 102 is in contact with the n$^+$-type diffusion layer 8 which is the region for leading out the collector.

The upper and side surfaces of the polycrystalline silicon layer 6 and the upper surfaces of the single-crystal silicon layer 12 and the intrinsic base film 14 are covered with a silicon nitride film 11 which has an emitter opening on an emitter forming region. In this emitter opening, the side surfaces of the silicon nitride layer 11 and the intrinsic base film 14 are covered with the silicon oxide film 15 which is a sidewall insulating film.

In the region surrounded by the silicon oxide film 15 on the intrinsic base film 14, there is formed an n-type single-crystal silicon film 18 which constitutes the emitter region.

On each of the polycrystalline silicon layers 6, 7 and the single-crystal silicon layer 18, there is formed a metal electrode 17 made of an aluminum type alloy, for example, AlSi.

In the bipolar transistor arranged as above, it is possible to increase sufficiently the impurity concentration of the base link region (a combination of the layers 12 and 13) irrespective of the impurity concentration of the intrinsic base film 14. Moreover, since the thickness of the base link region can be increased irrespective of the thickness of the intrinsic base film 14, it is possible to realize both the increase in the thickness of the intrinsic base film and the reduction in the resistance at the base link region at the same time.

Figure 1:
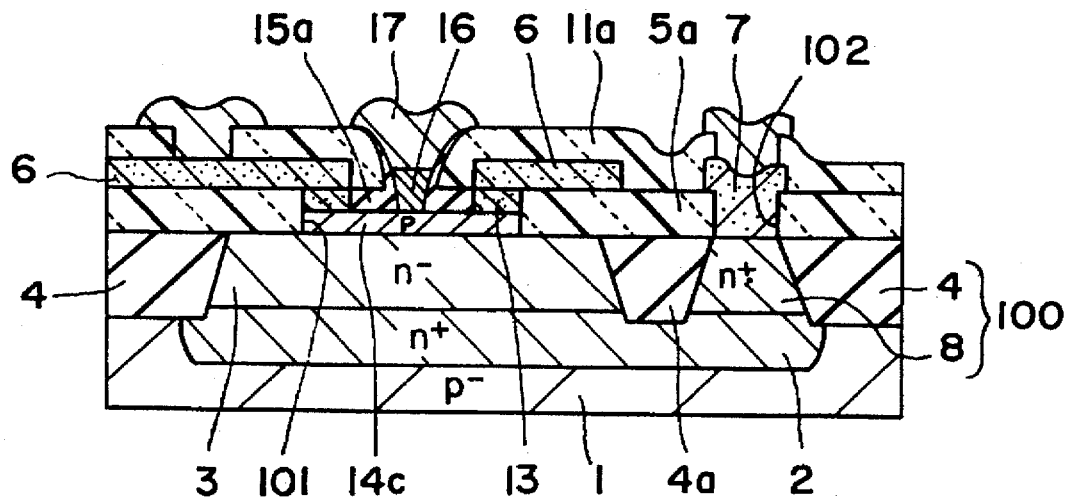
FIG. 1 is a diagrammatic sectional view showing a conventional semiconductor device of the kind to which the present invention relates.

It has been confirmed that the transistor having the dimension of the emitter opening as being 0.6×2 μm$^2$ exhibited the base resistance of 220 Ωm, which corresponds to 85% in the conventional transistor as shown in FIG. 1.

Next, a method for fabricating the semiconductor device of a first embodiment according to the invention is explained hereunder with reference to FIG. 3A through FIG. 3I which are diagrammatic sectional views showing the principal fabrication steps for the device.

First, an oxide film having a thickness of about 8000 Angstroms is formed by the thermal oxidation of the overall surface of the <100>-oriented p-type silicon substrate 1 having a resistivity of 10~20 Ω-cm and, then, on this oxide film, is provided a photoresist which is patterned by an ordinary lithographic technique. With this photoresist used as a mask, an SiO$_2$ film is etched using an HF-type etching solution, and the region of the SiO$_2$ where no photoresist is present thereon is removed. Thereafter, the photoresist is removed.

The surface of the p-type silicon substrate 1 at the region of the SiO$_2$ film that has been removed is oxidized for about 500 Angstroms in depth. This is to reduce any damage that may be caused by ion-implantation in the succeeding step and also to form an alignment pattern for subsequent lithography processes.

Next, an n$^+$-type buried layer 2 is selectively formed by ion-implantation of Arsenic (As) only in the region from which the SiO$_2$ film of about 6000 Angstroms described above has been removed. Conditions for ion-implantation include, for example, acceleration energy: 70 keV and dose: 5E15 cm$^{-2}$. After the ion-implantation, the layer is subjected to a thermal treatment under the temperature of 1100° C. for 3 hours to recover the damage caused during the ion-implantation and to diffuse the Arsenic implanted. The SiO$_2$ film on the surface is entirely removed using an HF-type etching solution. On the substrate surface at which the SiO$_2$ has been removed, there is formed a recess at the portion where the SiO$_2$ film of 500 Angstroms is formed. This recess serves as the alignment pattern for the subsequent processes.

For the formation of the n$^+$-type buried layer 2, the above ion-implantation process may be substituted by a method wherein a film with a material having a high concentration Arsenic (As) is formed and this film thus deposited is subjected to a thermal treatment to diffuse the Arsenic contained in the film. Also, as an n-type impurity, Antimony (Sb) may be used in place of Arsenic (As).

Next, prior to the formation of the selective oxide film 4 for element isolation, there is formed a p$^+$-type diffusion layer (not shown) as a channel stopper on the region where such oxide film 4 is formed. This diffusion layer is formed under such conditions that, for example, after the substrate surface is oxidized with a thickness of about 400 Angstroms, a photoresist is left at the region other than the desired region through a lithographic technique and, by using this photoresist as a mask, Boron (B) is ion-implanted. The ion-implantation conditions include, for example, acceleration energy: 110 keV and dose: 1E14 cm$^{-2}$, and the thermal treatment conditions include a treatment in a 1000° C. nitrogen atmosphere for 1 hour.

Then, the oxide film at the surface is entirely removed by an HF-type etching solution and an n-type epitaxial layer 3 is grown. Source gases make use of SiH$_4$ or SiH$_2$Cl$_2$ and the growth temperature is 1000° C.~1100° C. A doping gas employs PH$_3$. The epitaxial layer 3 thus obtained has a thickness of about 0.7 μm and an average impurity concentration, from its upper surface to a transition region to the n$^+$-type buried layer 2, of about 1×10$^{16}$ cm$^{-3}$.

Next, an SiO$_2$ film of about 500 Angstroms is formed on the surface and then a silicon nitride film having a thickness of 1000 Angstroms is deposited by an LPCVD (Low-Pressure Chemical Vapor Deposition) method. The growth conditions include a gas reaction of SiH$_2$Cl$_2$+NH$_3$ under the temperature of 700°~900° C. Then, a photoresist is patterned by the lithographic process and, using this photoresist as a mask, the silicon nitride film is selectively removed by dry-etching. If the dry-etching is terminated at the point when the SiO$_2$ film beneath the silicon nitride film with a thickness of about 100~200 Angstroms has been removed, the silicon nitride film can be completely removed without causing a damage to the underlying layer.

A selective oxide film 4 for isolating the epitaxial layer 3 into island regions and a selective oxide film 4a for isolating the collector region (3) from the collector lead-out region (8) above the buried layer 2 are formed by selective thermal oxidation using the patterned silicon nitride film as a mask.

The conditions for forming the selective oxide films 4 and 4a include a steam oxidation for 4 hours under the temperature of 1000° C. In this way, the oxide films of about 8000 Angstroms can be formed.

Next, the silicon nitride film used as the mask is completely removed by immersing in phosphoric acid H$_3$PO$_4$ for one hour.

Thereafter, a silicon oxide film 5 of about 1100 Angstroms is deposited on the surface of the silicon substrate 100, and only the portion of the silicon oxide film where the collector electrode will be formed is selectively removed by using a lithographic technique and a dry-etching method.

Next, using SiH$_2$Cl$_2$ as a starting material, a polycrystalline silicon film having a thickness of about 2000 Angstroms is deposited by the LPCVD method under a film forming temperature of 620° C. Then, by using the lithographic technique and the dry-etching process, the polycrystalline silicon film is patterned, and a polycrystalline silicon layer 6 for the base electrode and a polycrystalline silicon layer 7 for the collector electrode are formed. The photoresist is removed thereafter.

Next, by a lithographic technique, the photoresist is patterned so as to have an opening on the polycrystalline silicon layer 6 and, by using this photoresist as a mask, Boron (B) is ion-implanted under the conditions of acceleration energy: 20 keV and dose: 5E15 cm$^{-2}$. The photoresist is removed thereafter.

Then, by a CVD (Chemical Vapor Deposition) method, a silicon nitride film is deposited to a thickness of 1000 Angstroms and, by the lithographic technique and the dry-etching method, the silicon nitride film on the polycrystalline silicon layer 7 is removed. In this state, a thermal treatment under the temperature of 900° C. in POCl$_3$ is performed for 20 minutes whereby Phosphorous (P) is diffused from the opening of the silicon nitride film and the polycrystalline silicon layer 7 for the collector electrode turns to an n$^+$-type. At the same time, the epitaxial layer under the layer 7 is also doped thereby forming an n$^+$-type diffusion layer 8 which functions as the region for leading-out the collector. Then, the silicon nitride film thereabove is removed using phosphoric acid.

Figure 3A:
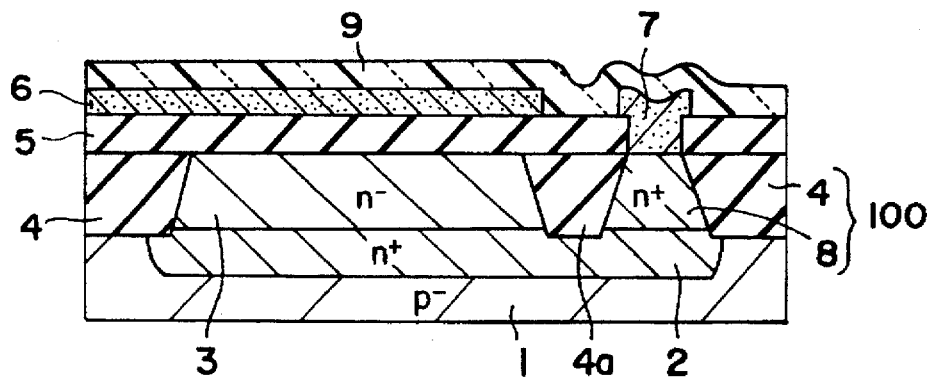
FIG. 3A through FIG. 3I are diagrammatic sectional views for showing fabrication steps of the semiconductor device of the first embodiment according to the invention.

Next, by the CVD method, a silicon nitride film 9 is deposited to a thickness of about 4000 Angstroms. This state is shown in FIG. 3A.

Next, a photoresist 10 is applied on the upper surface of the silicon nitride film 9 and, by a lithographic technique, a portion of the photoresist 10 where the base and the emitter will be formed is removed.

Figure 3B:
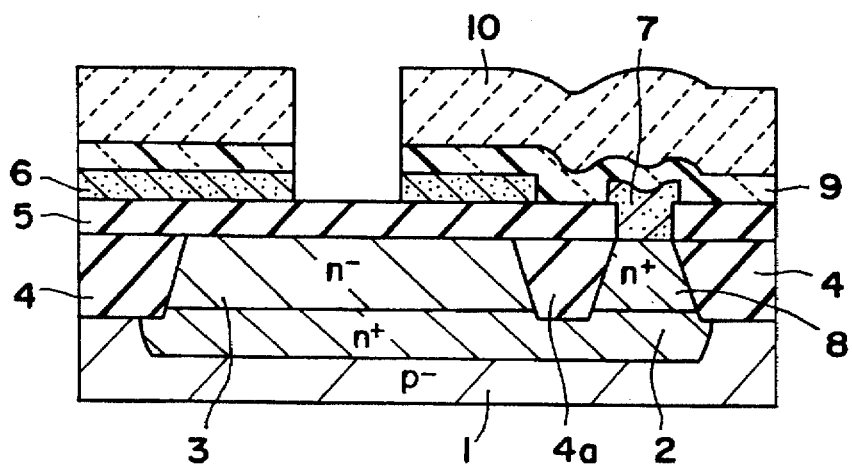

By using the photoresist 10 as a mask, the silicon nitride film 9 and the polycrystalline silicon film 6 are removed by dry-etching whereby a surface of the silicon oxide film 5 is exposed and a hole is formed. This state is shown in FIG. 3B. Thereafter, the photoresist 10 is removed.

Figure 3C:
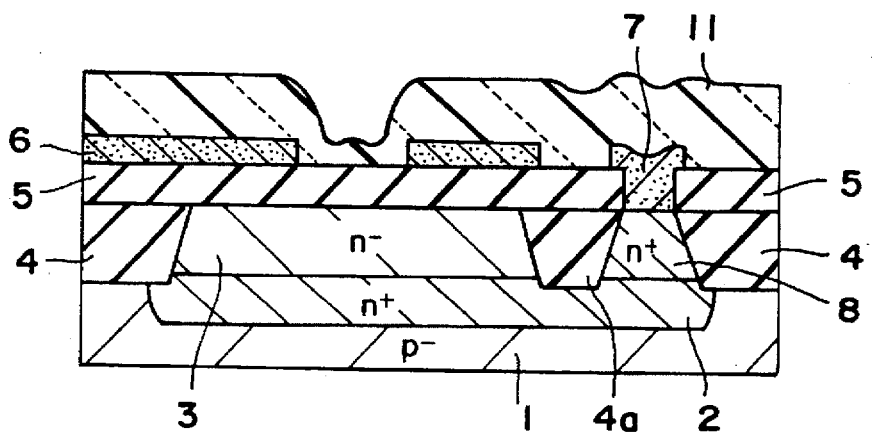

Then, as shown in FIG. 3C, a silicon nitride film 11 is deposited on the overall surface of the silicon nitride film 9 by the LPCVD method to increase its thickness. In FIG. 3C, in order to make the illustration simpler, the silicon nitride film 9 is not separately shown but shown as being included in the newly deposited silicon nitride film 11. Thus, it is seen that the silicon nitride film 11 is thin only at the opening portion on the emitter region.

Figure 3D:
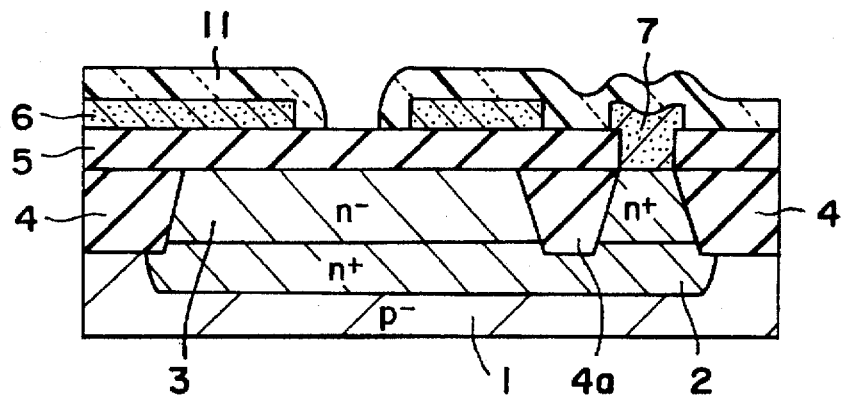

Next, the silicon nitride film is anisotropically dry-etched and, as shown in FIG. 3D, the surface of the silicon oxide film S on the emitter forming region is exposed. In this way, the polycrystalline silicon film 6 is in the state in which the upper and side surfaces thereof are covered with the silicon nitride film 11.

Figure 3E:
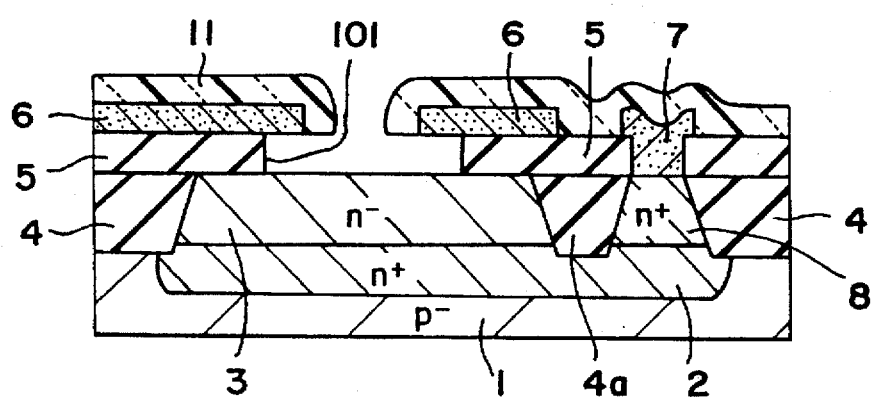

Next, as shown in FIG. 3E, by a wet-etching using buffered hydrofluoric acid (hereinafter referred to as "BHF"), the silicon oxide film 5 is side-etched from the opening portion of the silicon nitride film 11 for a predetermined distance whereby an opening 101 is formed. As a result, the upper surface of the n-type epitaxial layer 3 where the base will be formed is exposed. Also, the polycrystalline silicon film 6 for the base electrode extends horizontally over the region where the base is to be formed. The distance from the end of the extended film 6 to the sidewall of the silicon oxide film 5 is about 2000 Angstroms.

Then, by a UHV/CVD (Ultra High Vacuum/Chemical Vapor Deposition) method, a low temperature selective epitaxial growth of a p-type silicon is performed. This technique is fully described, for example, in "Symposium on VLSI Technology", 1992, pp. 62–63.

Prior to the epitaxial growth, a pretreatment is performed whereby a wafer is rinsed and a natural oxide film is removed by immersing the wafer in an etching solution for a short time (for example, for 30 seconds in BHF).

Figure 3F:
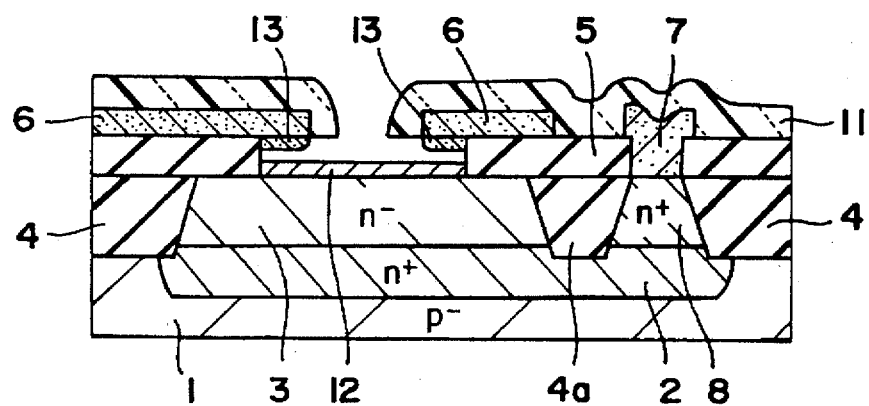

Thereafter, the wafer is placed in an UHV/CVD device wherein a heat treatment under the temperature of 850° C. is carried out for about 10 minutes for completely removing any natural oxide film that has not been removed by the above process with the etching solution. Then, as shown in FIG. 3F, by the low temperature selective epitaxial growth, a p-type single-crystal silicon layer 12 is grown on the exposed surface of the epitaxial layer 3 and at the same time as a p-type polycrystalline silicon layer 13 is grown from the exposed undersurface of the horizontally extended polycrystalline silicon layer 6. The growth conditions here include the substrate temperature: 605° C.; flow rate of Si$_2$H$_6$: 12 sccm; flow rate of Cl$_2$ for enhancing the selectivity: 0.03 sccm; pressure: in the order of 10$^{-4}$ Torr; and the growth rate: about 10 nm/min.

As a material for making the grown silicon film a p-conductivity type, B$_2$H$_6$ has been used. The impurity concentration of the silicon film increases corresponding to the increase in the flow rate of B$_2$H$_6$ and, in a range of the impurity concentrations from 1×10$^{16}$ cm$^{-3}$ to 5×10$^{20}$ cm$^{-3}$, such impurity concentration corresponds to the flow rate substantially linearly. In the present embodiment of the invention, the impurity concentration has been about 1×10$^{20}$ cm$^{-3}$.

Figure 3G:
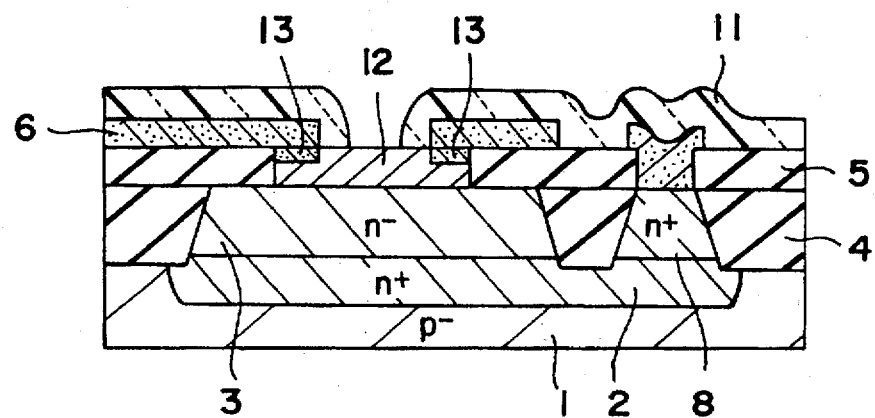

When the growth under the above condition continues for about 11 minutes, the single-crystal silicon layer 12 having a thickness of 110 nm is grown in the opening and, as shown in FIG. 3G, the opening 101 is filled with the silicon film.

Figure 3H:
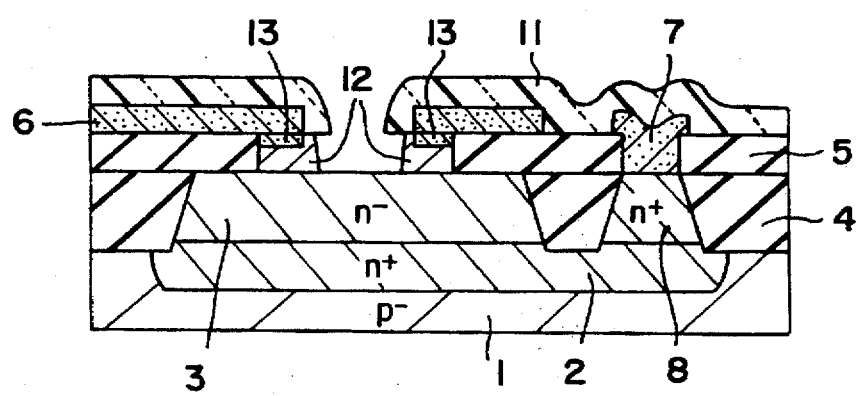

Thereafter, by using the silicon nitride film 11 as a mask, the single-crystal silicon layer 12 is anisotropically etched whereby the portion of the epitaxial layer 3 that corresponds to the opening in the silicon nitride film 11 is exposed as shown in FIG. 3H. The base link region is constituted by the polycrystalline silicon layer 13 and the single-crystal silicon layer 12 which has been left within the opening 101.

The above etching causes the damages to the surface of the epitaxial layer 3, which adversely affect the selective epitaxial growth to follow. In order to avoid this, the surface layer is oxidized to a thickness of about 20 nm and the resulting oxide film is removed.

Figure 3I:
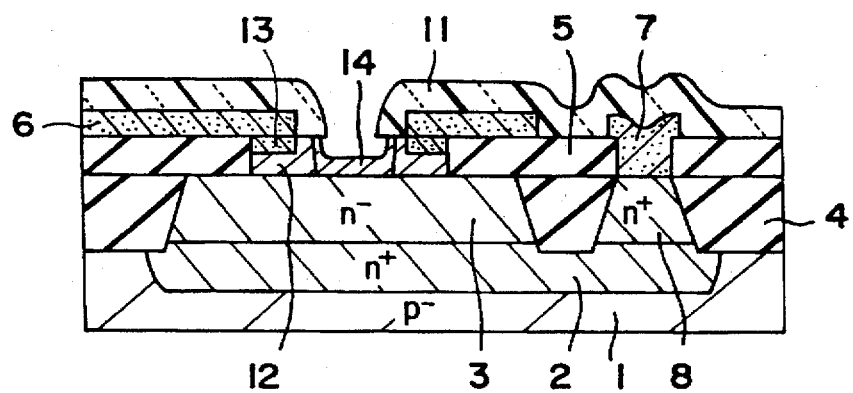

Next, as shown in FIG. 3I, an intrinsic base film 14 which will become a region for the intrinsic base is grown. The growth conditions here are the same as those for the growth of the base link region 12 except for the flow rate of B$_2$H$_6$. In the intrinsic base film 14 thus formed, the Boron concentration has been 1×10$^{19}$ cm$^{-3}$ and the film thickness has been 60 nm.

Then, by using the LPCVD method, there is formed a silicon oxide film 15 (see FIG. 2) which is anisotropically etched-back, whereby a silicon oxide sidewall film 15 is formed within the emitter opening, and a surface of the intrinsic base film 14 is exposed. Thereafter, the wafer is again placed in the UHV/CVD device and an n$^+$-type single-crystal silicon film 16 having an impurity concentration of 1×10$^{19}$ cm$^{-3}$ and a thickness of 150 nm is formed as the emitter region. The growth conditions here are also the same as those for the base link region (the combination of the single-crystal silicon layer 12 and the polycrystalline silicon layer 13) and the intrinsic base film 14 except for the point wherein PH$_3$ is used as a doping gas.

Next, for forming the electrodes, the silicon nitride film 11 is selectively etched and removed whereby openings are formed respectively on the polycrystalline layers 6 and 7. Then, an Al-type material is coated thereon and is patterned whereby metal electrodes 17, i.e, the base, emitter and collector electrodes, are formed. The resulting semiconductor device is as shown in FIG. 2.

In the resulting structure, the regions of the intrinsic base film 14 that are in contact with the n-type epitaxial layer 3 and with the single-crystal silicon film 16 have low impurity concentrations respectively and a region interposed between these regions has a high impurity concentration.

According to the above described fabrication method, each of the regions of a transistor is formed without involving diffusion processes, so that it is possible to form the intrinsic base film with high precision and reduction in its thickness and it is possible to fabricate a transistor capable of operating at a high speed.

In explaining the present embodiment, reference is made only to an npn-type bipolar transistor. However, it is to be noted that, only by changing the combinations of impurities to be implanted, a pnp-type bipolar-transistor can also be fabricated in a similar manner.

Figure 4:
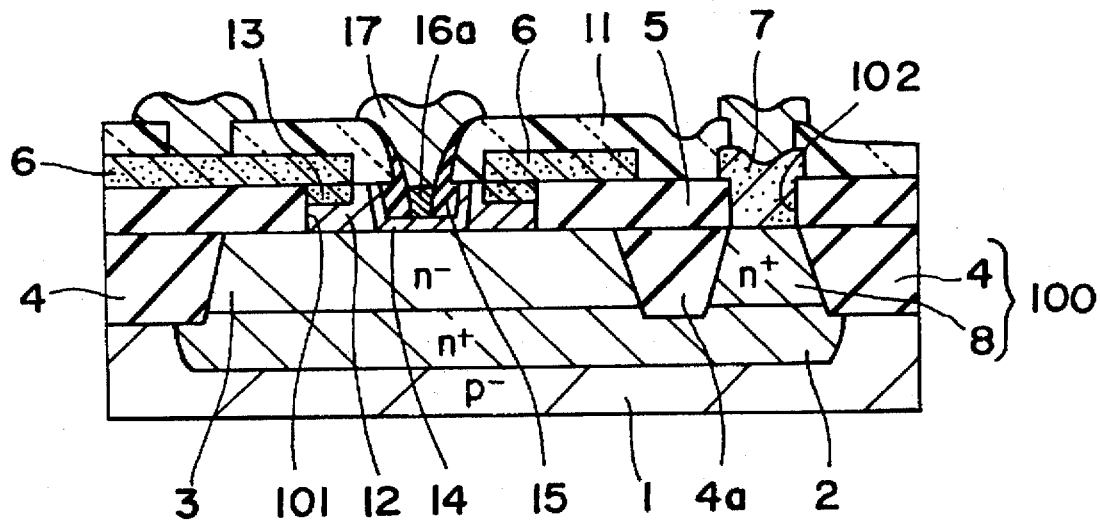
FIG. 4 is a diagrammatic sectional view showing a semiconductor device of a second embodiment according to the invention.

Next, FIG. 4 shows in sectional view a structure of a second embodiment according to the invention.

According to the second embodiment, the emitter region is constituted by a single-crystal silicon carbide (SiC) film 16a in place of the single-crystal silicon (Si) film 16 in the above first embodiment. In other respects, the structure is the same as that of the first embodiment. This single-crystal silicon carbide film 16a is formed by the UHV/CVD method using $C_2H_6$ and $Si_2H_6$ as source gases.

In this embodiment, since the forbidden band width of the silicon carbide SiC constituting the emitter is wider than that of the silicon Si constituting the base, the flow of minority carriers injected from the base region to the emitter region is blocked thereby enabling to increase a current amplification factor $h_{FE}$ of the transistor.

Generally, when the width of a neutral base (a base region not depleted) is made thin in order to enhance a cut-off frequency $f_T$, it is necessary to increase a doping concentration within the base for avoiding punch-through characteristics. This results in the lowering of the current amplification factor $h_{FE}$. However, the present embodiment of the invention provides a solution to this problem.

Figure 5:
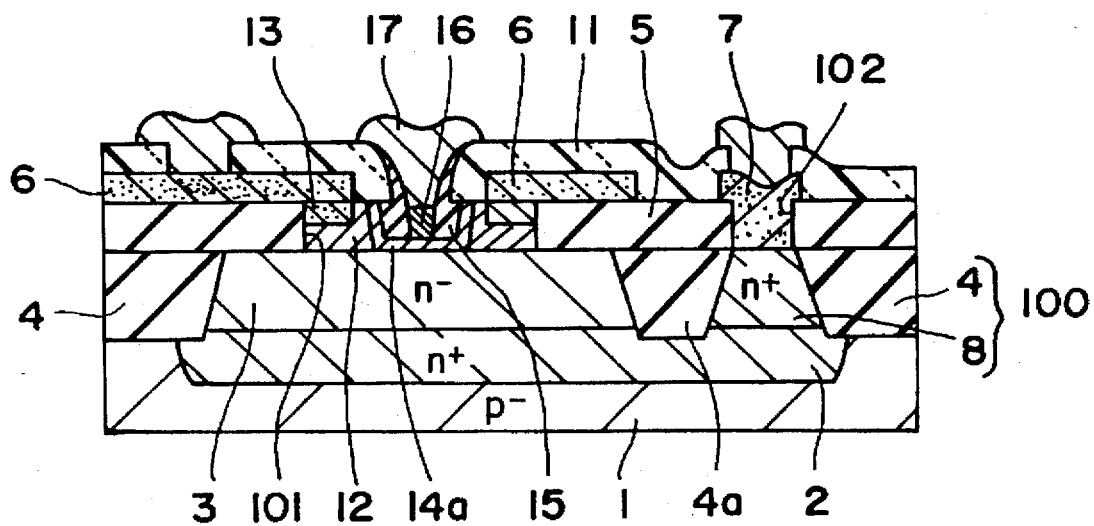
FIG. 5 is a diagrammatic sectional view showing a semiconductor device of a third embodiment according to the invention.

FIG. 5 shows in sectional views a structure of a third embodiment according to the invention.

In this embodiment, the base region is constituted by an SiGe intrinsic base film 14a. In other respects, the structure is similar to that of the first embodiment. The base film 14a is formed by using $Si_2H_6$ and $GeH_4$ as source gases during the film formation by the UHV/CVD process. The film growth conditions are as described in "Symposium on VLSI Technology", 1992, pp. 62–63 referred to above. The SiGe intrinsic base film 14a thus formed has a thickness of 500 Angstroms, a Ge concentration of 10 mole %, and a Boron concentration of $8\times10^{18}$ cm$^{-3}$.

In this embodiment, the forbidden band width of the SiGe alloy constituting the base is narrower than that of the silicon Si constituting the emitter. The amount of this reduction is dependent on the mole % of Ge and the magnitude of strain in the silicon germanium alloy film. The difference in the forbidden band widths becomes barriers for the minority carriers injected from the base to the emitter and this suppresses an increase in the base current and enhances the cut-off frequency $f_T$ of the transistor. Therefore, even in the case where, when the base layer is made thin, the concentration of the base layer is made high in order to maintain the collector-emitter breakdown voltage $BV_{CEO}$ above a certain predetermined value, it is possible to make the current amplification factor $f_{FE}$ sufficiently large.

The relationship between the forbidden band width Eg3 of the material of the intrinsic base film 14a and the forbidden band width Eg4 of the single-crystal silicon film 16 is $Eg3 \leq Eg4$. Also, the intrinsic base region includes a region in which the forbidden band width gradually increases from the n-type epitaxial layer 3 towards the single-crystal silicon film 16.

Figure 6:
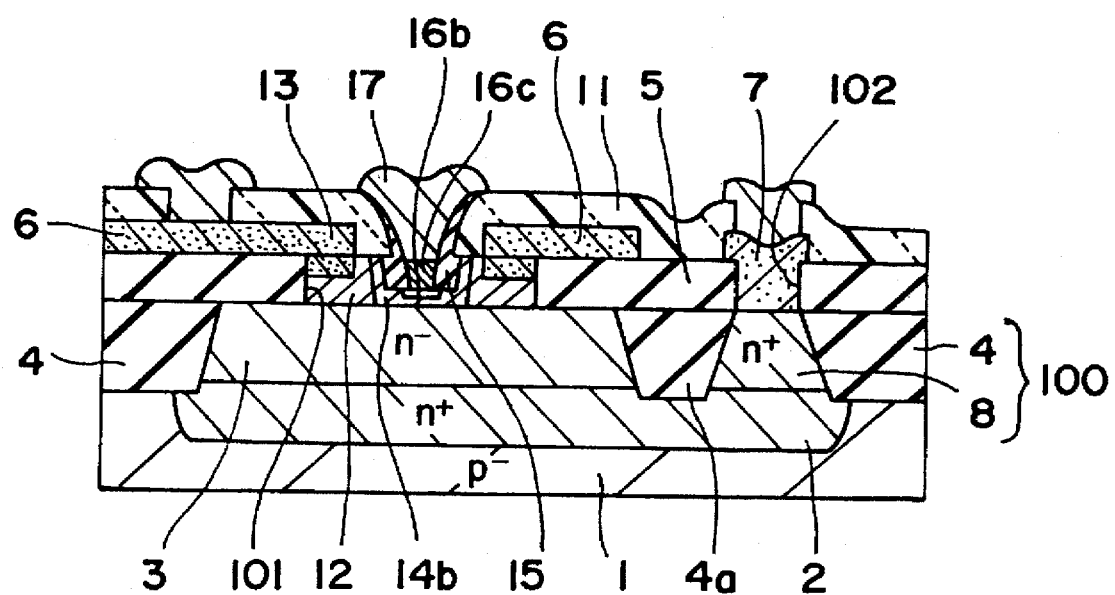
FIG. 6 is a diagrammatic sectional view showing a semiconductor device of a fourth embodiment according to the invention.

FIG. 6 shows in sectional view a structure of a fourth embodiment according to the invention. In the structure according to this embodiment, the differences from the first embodiment are that (1) the intrinsic base film is constituted by a multi-layer film, (2) the emitter region is constituted by a diffusion layer, and (3) the polycrystalline silicon film for the emitter is formed on the emitter region. In other respects, the structure is similar to that of the first embodiment.

The multi-layer intrinsic base film 14b comprises three layers, namely, from the bottom, (1) a p$^-$-type SiGe alloy layer having a Ge concentration of 15 mole %, (2) a p$^+$-type SiGe alloy layer in which a Ge concentration varies from 15 mole % to 0 mole %, and (3) a p$^-$-type silicon single-crystal layer. The intrinsic base film thus formed by multi-layers is remarkably effective in shortening the transit-time of the minority carriers through the base as described in Japanese Patent Application Kokal Publication No. Hei 5-62991 (Published on Mar. 12, 1993).

Also, the emitter region 16b in the present embodiment is a region formed by impurity diffusion from a polycrystalline silicon film 16c to which an n-type impurity is implanted in a high concentration. It is desirable that the depth (thickness) of the emitter region 16b formed by a thermal diffusion be about the same as the thickness of the uppermost p$^-$-type silicon single-crystal of the three-layered intrinsic base film 14b.

During the formation of the diffusion layer, Boron (B) in the intrinsic base film 14b diffuses to the collector side and the base-collector junction surface moves downwards, but this illustration is omitted in the drawings.

The method whereby the single-crystal emitter revlon is formed on a surface region of the single-crystal base film by impurity diffusion from the n$^+$-type polycrystalline silicon as in the present embodiment can well be applied to a homogeneous junction as in the first embodiment.

As explained above, according to the invention, the intrinsic base region and the base link region are formed by using epitaxial layers formed separately from each other so that the sheet resistance of the base link region can be made sufficiently lower than that of the intrinsic base. Moreover, since the thickness of the intrinsic base can be made thin without reducing the thickness of the base link region, it is possible to realize a bipolar transistor in which a cut-off frequency $f_T$ is high and yet the base resistance is low, thereby ensuring a high speed performance.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A semiconductor device comprising:
   a first semiconductor region of a first conductivity type;
   a first insulating film surrounding said first semiconductor region;
   a second insulating film on said first insulating film and said first semiconductor region and having an opting on said first semiconductor region;
   a second semiconductor region of a second conductivity type with a high impurity concentration covering a side periphery of the opening on said first semiconductor region and having a thickness substantially equal to that of said second insulating film;

an intrinsic base film of the second conductivity type, said intrinsic base film being formed of a single layer, being substantially U-shaped in cross section and covering said first semiconductor region and an inner periphery of said second semiconductor region, a bottom portion of said U-shaped intrinsic base film having a thickness thinner than that of said second insulating film, said intrinsic base film being disposed such that a bottom surface of said second semiconductor region and a bottom surface of said intrinsic base film are in contact with said first semiconductor region in substantially the same horizontal plane, and such that an inside upper surface of said intrinsic base film is located at a position lower than that of an upper surface of said second semiconductor region;

a sidewall insulating film covering an inner periphery of sidewalls of said intrinsic base film; and an emitter region of the first conductivity type on said intrinsic base film and surrounded by said sidewall insulating film.

2. A semiconductor device according to claim 1, in which said intrinsic base film and said emitter region are constituted by materials satisfying a relationship of Eg3≦Eg4, wherein Eg3 is a forbidden band width of the material of said intrinsic base film and Eg4 is that of said emitter region.

3. A semiconductor device according to claim 2, in which said intrinsic base film includes a region in which said forbidden band width gradually increases from said first semiconductor region towards said emitter region.

4. A semiconductor device according to claim 3, in which said intrinsic base film has regions whose impurity concentrations are respectively low at portions in contact with said first semiconductor region and said emitter region and a region whose impurity concentration is high at a portion interposed between said regions.

5. A semiconductor device according to claim 1, in which said emitter region is constituted by a polycrystalline semiconductor layer of a high impurity concentration, and which comprises a diffusion region of the second conductivity type within a surface region of said intrinsic base film under said emitter region, said diffusion region diffused of impurities that are within said emitter region.

6. A semiconductor device according to claim 1, in which said second semiconductor region has at its upper peripheral portion a first polycrystalline semiconductor layer, and which comprises a second polycrystalline semiconductor layer of the second conductivity type connected to an upper surface of said first polycrystalline semiconductor layer and extending horizontally on said second insulating film.

7. A semiconductor device according to claim 1, in which said first conductivity type is an n-type and said second conductivity type is a p-type.

8. A semiconductor device according to claim 1, in which said emitter region is made of a single-crystal silicon.

9. A semiconductor device according to claim 1, in which said emitter region is made of single-crystal silicon carbide.

10. A semiconductor device according to claim 1, in which said emitter region is made of a polycrystalline silicon.

11. A method for fabricating a semiconductor device, said method comprising the steps of:

providing a first semiconductor region of a first conductivity type;

providing a first insulting film surrounding said first semiconductor region;

providing a second insulating film on said first semiconductor region and said first insulating film;

providing a polycrystalline semiconductor layer over at least said second insulating film such that it extends over said first semiconductor region;

forming, on said polycrystalline semiconductor layer and said second insulating film, a third insulating film of an insulating material having etching characteristics different from those of said second insulating film;

etching a hole in said third insulating film and said polycrystalline semiconductor layer to expose a portion of a surface of said second insulating film;

depositing an insulating material having etching characteristics different from those of said second insulating film over said polycrystalline semiconductor layer and on said hole to increase the thickness of said third insulating film;

removing a part of said third insulating film in the vicinity of said hole to expose a portion of the surface of said second insulating film;

etching said second insulating film through the hole formed by the removed portion of said third insulating film to expose a portion of a surface of said first semiconductor region and to undercut a portion of said third insulating film under said third insulating film and said polycrystalline semiconductor layer such that there is formed an opening and a cantilever structure consisting of said third insulating film and said polycrystalline semiconductor layer extending partly over said opening;

forming a second semiconductor region by growing a semiconductor layer containing impurities of said second conductivity type in a high concentration within said opening;

etching said second semiconductor region with said third insulating film used as a mask to expose a part of the surface of said first semiconductor region in said opening;

forming an intrinsic base film of the second conductivity type having an impurity concentration lower than that of said second semiconductor region on the surface of said first semiconductor region and on the inner periphery of said second semiconductor region to a thickness not exceeding that of said semiconductor region;

forming a sidewall insulating film over inner periphery portions of side walls of said intrinsic base film; and forming an emitter region of the first conductivity type on said intrinsic base film and surrounded by said sidewall insulating film.

\* \* \* \* \*

UNITED STATES PATENT AND TRADEMARK OFFICE
CERTIFICATE OF CORRECTION

PATENT NO.    : 5,668,396
DATED         : September 16, 1997
INVENTOR(S)   : Fumihiko SATO It is certified that error(s) appears in the above-identified patent and that said Letters Patent is hereby corrected as shown below:

Col. 1, line 36, change "82" to --$\mu$--.

line 59, change "8" to --6--;

Col. 2, line 9, change "8" to --6--.

Col. 5, line 13, change "18" to --16--;

line 15, change "18" to --16--;

line 37, change "8000" to --6000--.

Col. 10, line 36, change "revlon" to --region--.

Signed and Sealed this

Twenty-first Day of April, 1998

*Attest:*

BRUCE LEHMAN

*Attesting Officer*  *Commissioner of Patents and Trademarks*